United States Patent [19]

Bareither

[11] Patent Number: 6,097,230
[45] Date of Patent: Aug. 1, 2000

[54] CLOCK-INDEPENDENT LATCH SETUP-AND-HOLD TIME IN A COMBINED D-TYPE LATCH AND FLIP-FLOP

[75] Inventor: Juergen Bareither, Tiefenbach, Germany

[73] Assignee: Texas Instruments Deutschland GmbH, Freising, Germany

[21] Appl. No.: 09/207,087

[22] Filed: Dec. 7, 1998

Related U.S. Application Data

[60] Provisional application No. 60/067,707, Dec. 8, 1997.

[51] Int. Cl.$^7$ .................................................. H03K 3/356
[52] U.S. Cl. .......................................... 327/202; 327/203
[58] Field of Search ..................................... 327/199, 200, 327/201, 202, 203, 208–213, 218, 224, 225

[56] References Cited

U.S. PATENT DOCUMENTS 5,081,377  1/1992  Freyman .................................. 327/203
5,656,962  8/1997  Banik ...................................... 327/202
5,905,393  5/1999  Rinderknecht et al. ................. 327/202

FOREIGN PATENT DOCUMENTS 0 567 716 A1  11/1993  European Pat. Off. .
61-113319  5/1986  Japan .

*Primary Examiner*—Tuan T. Lam
*Attorney, Agent, or Firm*—J. Dennis Moore; Wade James Brady, III; Frederick J. Telecky, Jr.

[57] ABSTRACT

A combined D-type latch and D-type flip-flop circuit where the latch setup-and-hold time is independent of the clock state. This is accomplished in one method by rerouting the data path to the Master to provide equivalent delays to both the Master and the Slave. In a second method, a clocking circuit provides on-board clocking where the data ia always latched first into the Slave, and after a fixed delay, the data are latched into the Master.

24 Claims, 4 Drawing Sheets

CLOCK-INDEPENDENT LATCH SETUP-AND-HOLD TIME IN A COMBINED D-TYPE LATCH AND FLIP-FLOP

This application claim priority under 35 USC § 119(e)(1) of provisional application No. 60/067,707 filed Dec. 8, 1997.

BACKGROUND AND SUMMARY OF THE INVENTION

The application is related to combined D-type latch and flip-flop integrated circuits.

BACKGROUND

Today's high-speed bus and point-to-point applications require devices that can provide high performance. Power and speed are two of the main concerns. A primary design parameter affecting speed is the propagation delay of signals through the chip. As more outputs switch, propagation delays for conventional devices degrade rapidly. A primary use of the these devices is for bus interface applications— the devices more commonly known as universal bus transceivers. Examples of devices currently available and manufactured by Texas Instruments, Inc., include the ABT, LVT, and ALVT family of chips, and the 16500, 16600, and 18502 series (ABT16500, LVTH18502, ALVTH16600, ALVC16601). These logic families may comprise CMOS as well as BiCMOS structures.

In most designs with a combined D-type latch and D-type flip-flop, a problem occurs where the setup-and-hold time of the latch-enable signal is dependent on the clock state when the data is being stored either in the Master or the Slave of the flip-flop. The setup time is the minimum interval required for the logic levels to be maintained constantly on the inputs prior to the triggering edge of the clock/latch pulse. The hold time is the minimum interval of the time required for the logic levels to remain on the inputs after the triggering edge of the clock/latch pulse. Both the setup and hold minimum time intervals are critical in order for the levels to be reliably clocked/latched into the flip-flop. The data propagation delay time for the Master is normally delayed, to achieve a zero or even negative clock hold time (according to customer/specification requirements). This delay also influences the setup-and-hold time of the latch-enable signal (if the data is latched into the Master). Therefore, the data propagation delay times for Master and Slave are very different. Consequently the latch-enable setup-and-hold time varies significantly from the clock state (e.g. see the ABT16501 bus-interface device specification). Clock-Independent Latch Setup-and-Hold Time in a Combined D-type Latch and Flip-Flop This application discloses two methods for providing clock independent latch-enable and setup-and-hold functions in a combined D-type latch and D-type flip-flop circuit. The latch-enable setup-and-hold time window is very small and independent of the clock state. In the disclosed embodiments, the Master/Slave data propagation delay times are nearly identical. Furthermore, the data are always stored in the Slave.

One advantage is that the innovative methods provide this feature without decreasing the device performance. Another advantage is that characterization and rest times are reduced. The characterization time is the time needed to determine the device behavior over, for example, supply voltages in the range of e.g. 2.5V–3.6V. temperature in the range of e.g. minus 55 degrees C. to plus 150 degrees C. If the latch setup and hold times are independent of the clock state, this has to be done for only one clock case. The test time is defined as the time needed for production probing and final test. Only one test cycle per clock state is required for this test. Specification of these times is simplified in that it is not necessary to specify the latch setup and hold times for different clock states (see, for example, the ABT Bus Interface Logic Data Book regarding the SN74ABT16500 chip). Another advantage is that this innovative feature is obtained with minimal or no additional increase in chip area. In one method, there is no increase in chip area. In the other method, the increase in chip area is minimal. Another advantage is that the setup-and-hold time of the clock signal can be controlled without influencing the setup-and-hold time of the latch-enable signal.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Conventional Circuit

Figure 3:
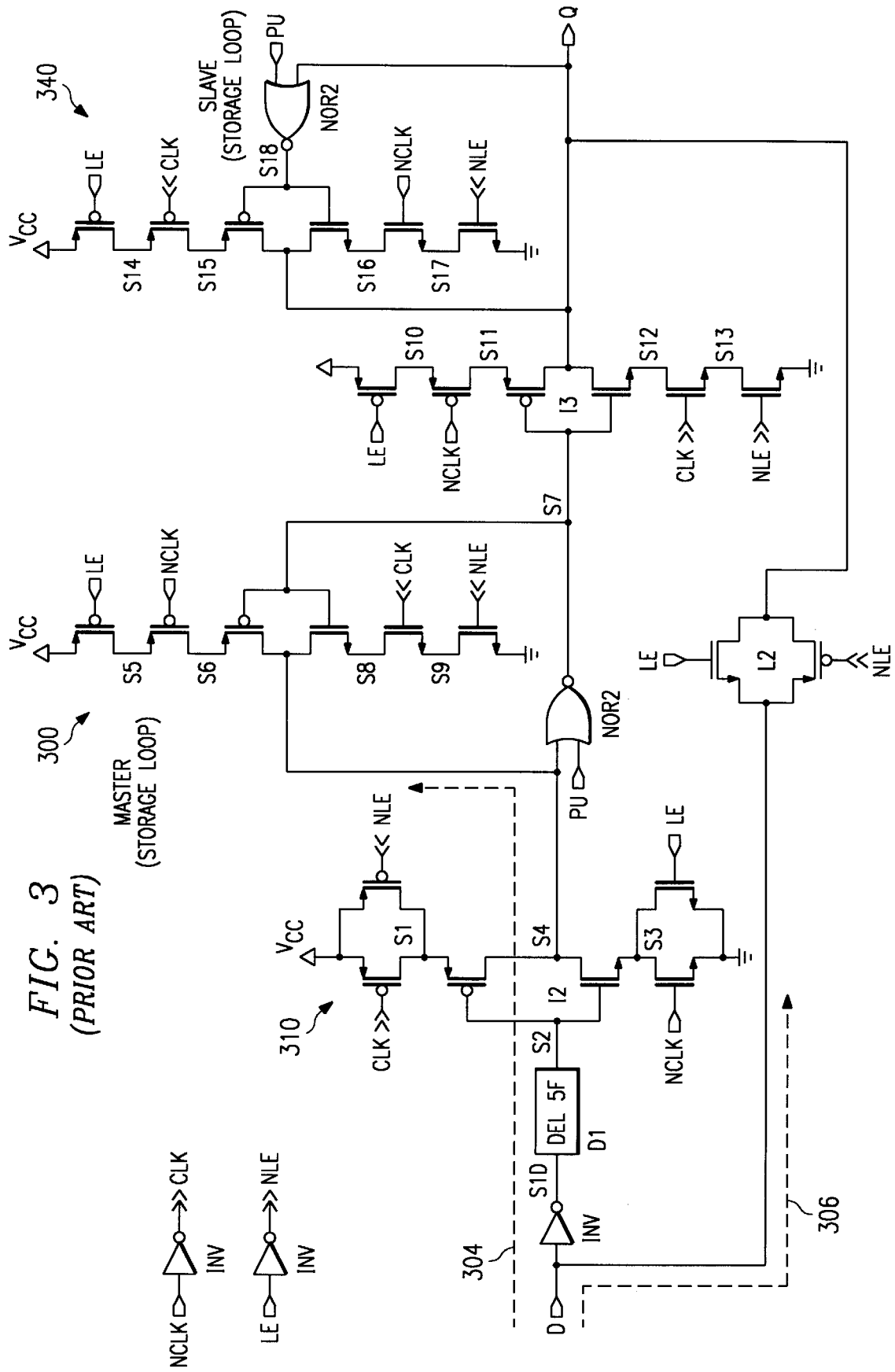
FIG. 3 shows a circuit diagram of a conventional combined D-type latch and D-type flip-flop.

D-type latches and D-type flip-flops are used extensively in electronic applications. A conventional combined D-type latch and Master/Slave flip-flop is shown in FIG. 3. The latch/flip-flop is in transparent mode if the LE signal is in the high state, with the complementary NLE signal being low. In transparent mode, transfer gate L2 (transistor pair MN13/ MP13) is ON and data at the latch/flip-flop input is passed unchanged directly to the output. The L2 circuit works like a noninverting bus driver. Data is stored either in the Master 300 or the Slave 340 with a high-to-low transition of the LE signal, and depending on the level of the CLK/NCLK signals. If the CLK signal is high, data is stored in the Master storage loop 300. If the CLK signal is low, data is stored in the Slave storage loop 340.

Data is latched only into the Master storage loop 300 with a high-to-low transition of the LE signal (transistors MP1 and MN5 turned on), transistors MP3 and MN3 turned on (activating the Master storage loop 300), and transistors MP4 and MN4 turned off (deactivating the Slave storage loop 340). The complementary clock signals CLK and NCLK provide the clocking for both storage loops, as well as the entire chip. In this scenario, the data signal path 304 is as follows: data at input D is passed through an inverter I1 into a delay circuit D1 to regulate the clock setup-and-hold time. Regulation is obtained with delay D1 by controlling the propagation delay time of the data to the Master storage loop 300. Therefore, the clock setup-and-hold time is controlled and the clock hold time can be regulated to zero or even negative values. Exiting delay D1, the data signal is passed to an input structure 310 which is an inverter I2 comprising both a p-channel CMOS device MP11 and an n-channel CMOS device MN7 (these devices may also NMOS/PMOS architectures). The p-channel device MP11 is connected to Vcc through either one or both of two p-channel CMOS devices (MP8 and MP9) whose gates are controlled to allow the connection to Vcc. If either the CLK or NLE signals are low, a path to Vcc exists and node S4 will be pulled high (provided node S2 is low to turn ON the p-channel device MP11). The n-channel device MN7 is connected to ground GND through either one or both of two n-channel CMOS devices (MN10 and MN11) whose gates are controlled to allow the connection to GND. If either of the NCLK or LE signals are high, a path to GND exists and node S4 will be pulled low (provided node S2 is high to turn ON the n-channel device MN7). The data signal exits the inverter I2 at output node S4. The data is then passed into the Master storage loop 300.

Data is latched only into the Slave storage loop 340 with a high-to-low transition of the LE signal (transistors MP2 and MN6 turned on), transistors MP4 and MN4 turned ON (activating the Slave storage loop 340), and transistors MP3 and MN3 turned OFF (deactivating the Master storage loop 300). The complementary clock signals CLK and NCLK provide the clocking for both storage loops. In this scenario, the data signal path 306 is as follows: data at input D is passed through the transfer gate L2 to the Slave storage loop 340 and Q output.

Due to the very different propagation delay times of the data signal paths (304 vs 306), the latch-enable setup-and-hold times depend on a proper timing relationship with the clock state to properly latch the data. For example, an ABT16500 device works like a flip-flop or a latch. If the device works as a latch, the clock signal is a stable high or low. If in the flip-flop mode, the CLK changes state. Therefore different propagation delay times produce different latch-enable setup-and-hold time.

The disclosed innovative circuit alleviates the problem associated with clock-state dependency.

Clock-Independent Circuits

Figure 1:
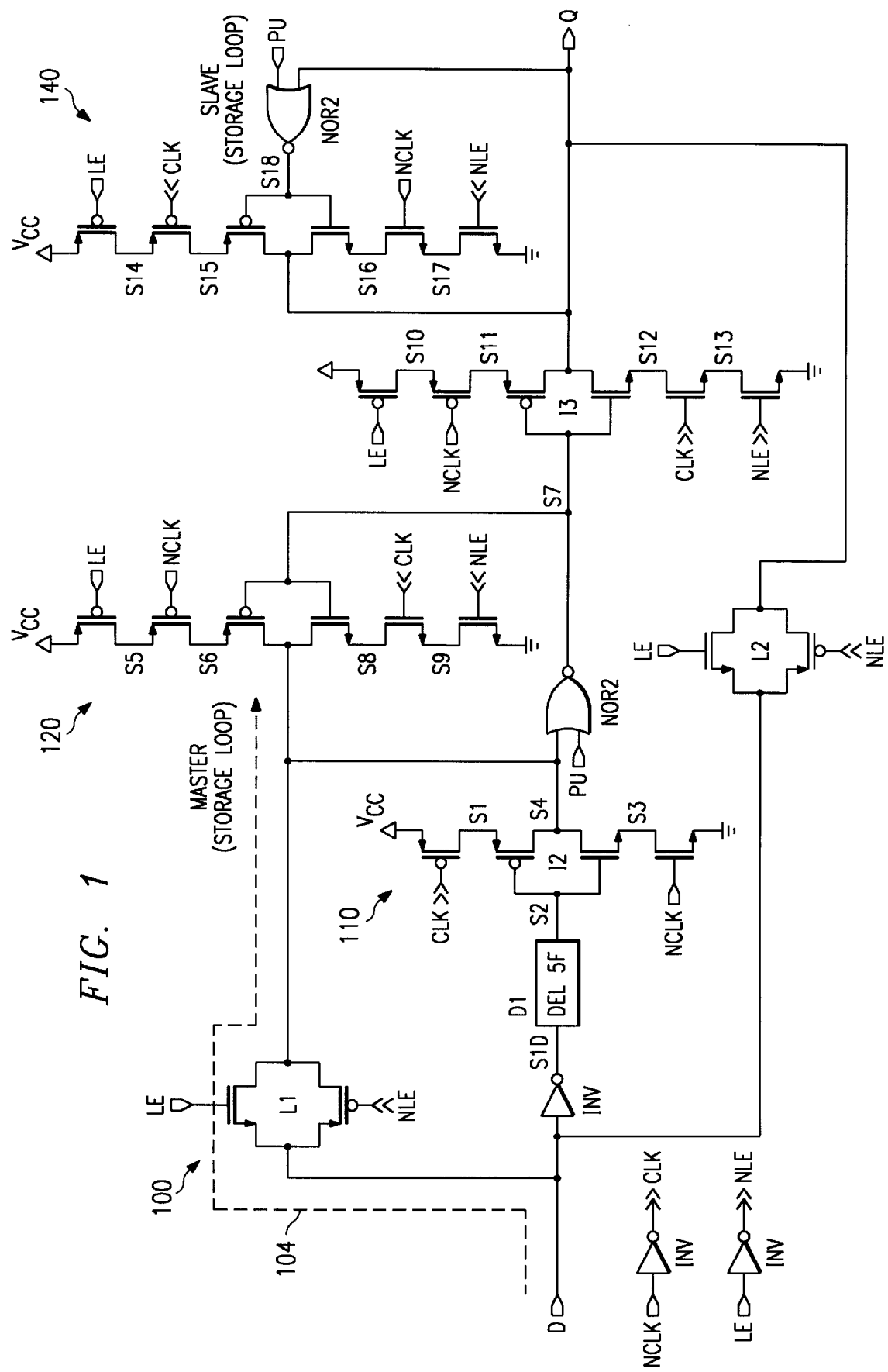
FIG. 1 shows a circuit diagram of a preferred embodiment with a different data signal path to the Master storage loop.

FIG. 1 shows a circuit diagram of a preferred embodiment utilizing a different path to the Master storage loop. Transistors MP9 and MN11 used in the conventional latch/flip-flop (FIG. 3) are needed to store the data in the Master storage loop 120 with a high-to-low transition of the LE signal. To shorten the conventional data signal path 306 (FIG. 3) and obtain a near identical Master/Slave data propagation delay time, both transistors MP9 and MN11 have been removed. Transistors MNH1 and MPH1 have been added and comprise a circuit 100 interposed between the D input and Master storage loop 120. If the latch/flip-flop is in the transparent mode (LE is high), the data can be latched into the Master storage loop 120 over the signal path 104 (from input D through additional circuit 100 to output node S4 and Master storage loop 120). The data signal paths for the Master and the Slave are now essentially identical in the latch/transparent mode, and consequently the setup-and-hold times for the latch-enable signal are also nearly identical. Therefore the latch-enable setup-and-hold times are independent of the clock state.

Figure 2:
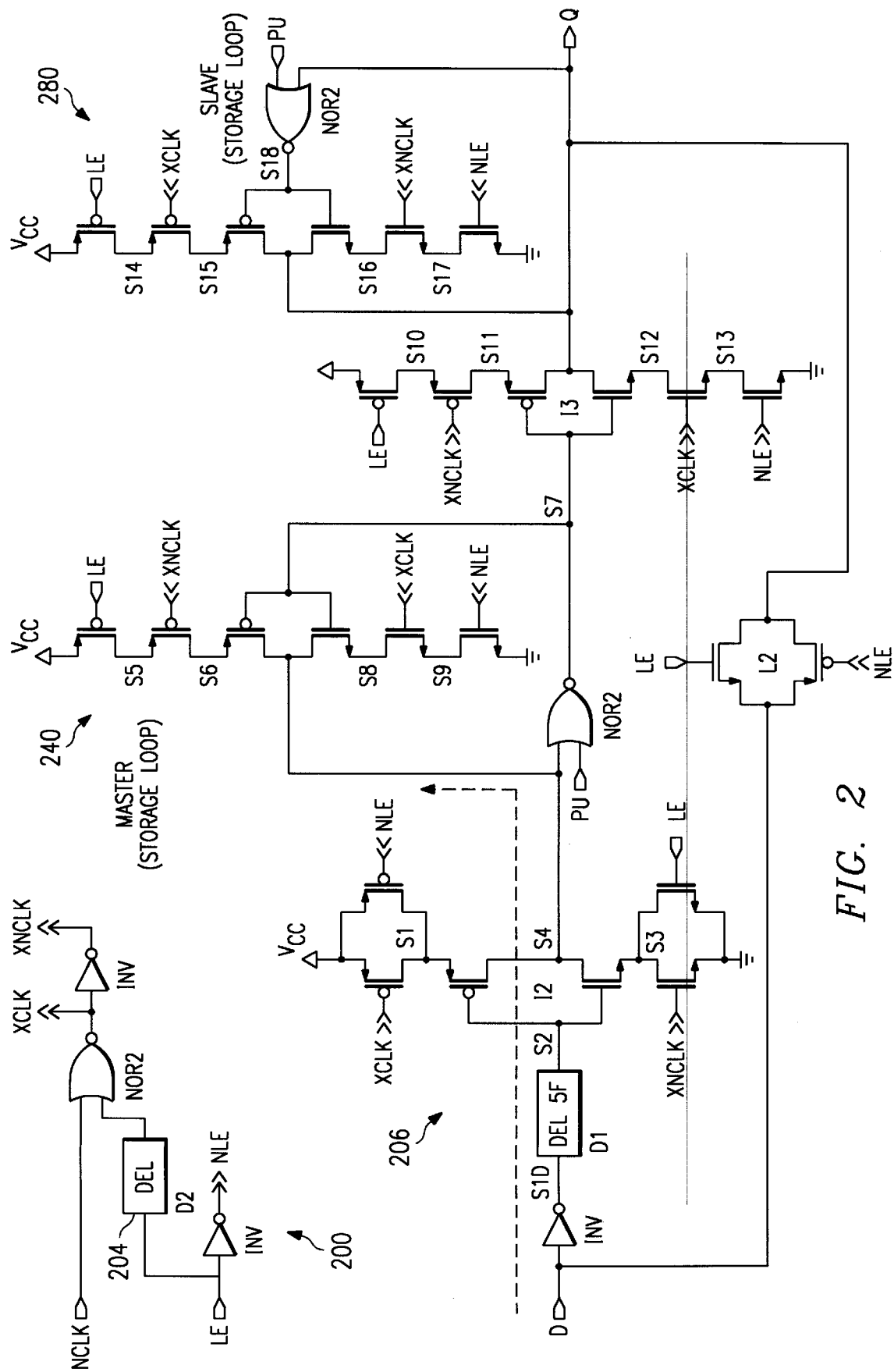
FIG. 2 shows a preferred embodiment where data are always stored in the Slave.

In FIG. 2, a second method is shown where the data is always stored in the Slave storage loop 280. If NCLK is high, data is always latched into the Slave storage loop 280. When NCLK is low, the data is latched first into the Slave, and after delay time D2, the data is latched into the Master storage loop 240 (for delay D2 greater than delay D1). This is achieved by deriving all chip clocking signals from a logic combination of the latch-enable signal LE and a NCLK clock signal (clocking circuitry 200). The clocking circuitry 200 output signals XCLK and XNCLK are generated for the entire flip-flop. An additional delay 204 is required to hold the data in the Slave 280 until the data has reached the Master 240.

When NCLK is high, and in latch/transparent mode (LE is high), XCLK is low, and inverted signal XNCLK is high. The Master storage loop 240 is deactivated when transistors MP3 and MN3 are turned OFF, and the Slave storage loop 280 is activated when transistors MP4 and MN4 turn ON. In this scenario, the data are latched only in the Slave with a high-to-low transition of the LE signal. This case is identical with the conventional latched flip-flop.

When NCLK is low (and LE is high), again, XCLK is low and XNCLK is high. The Master storage loop 240 is again deactivated when transistors MP3 and MN3 are OFF. Again, the Slave storage loop 280 is activated when transistors MP4 and MN4 turn ON. The data is stored in the Slave with a high-to-low transition of the LE signal. If the time delay of the latch-enable signal through delay 204 is greater than the signal delay time through signal path 206 (input D-inverter I1-delay D1-node S2-inverter I2-node S4-Master storage loop), the Master 240 can store the data with the delayed high-to-low transition of the XNCLK signal, and the delayed low-to-high transition of the XCLK signal. Thus the Slave storage loop 280 holds the data, as long as the data signal has reached the Master storage loop 240. If the data is always stored in the Slave 280, there exists only one data path and therefore no different setup-and-hold times for different clock states. Therefore, the setup-and-hold times of the latch-enable signal are independent of the clock state.

Using this circuit, the setup-and-hold times of the clock signal can be controlled without influencing the setup-and-hold times of the latch-enable signal. This is accomplished by adding a delay circuit 204 to the data propagation delay time for the Master storage loop 240.

Figure 4:
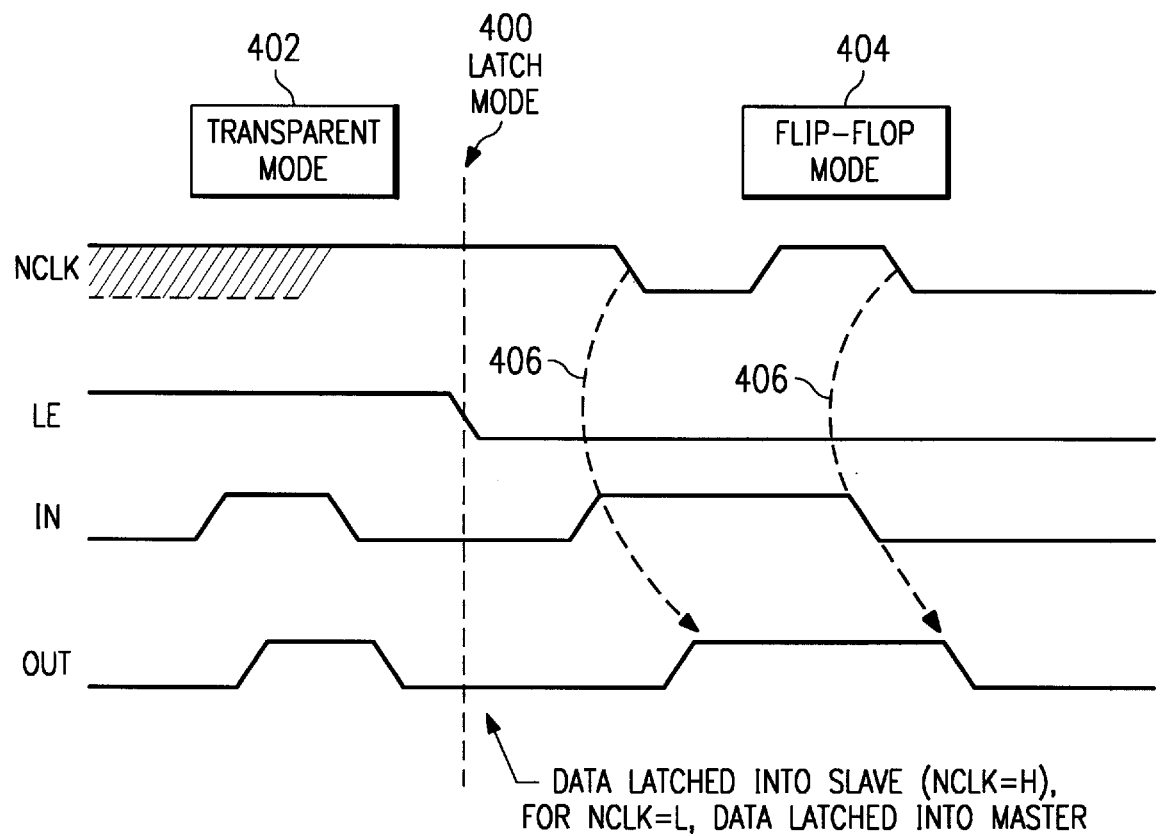
FIG. 4 shows a timing diagram of the preferred embodiment.

FIG. 4 shows a timing diagram of the preferred embodiment. In transparent mode 402, data pulse IN at the input is simply moved through a transfer gate L2 to the output. Note that the OUT and IN data pulses are similar with the primary difference being a propagation delay time. Also note that transparent mode 402 is entered when the latch-enable signal LE is high.

Latch mode 400 exists with a high-to-low transition of the latch-enable signal LE, and data is latched into the Slave storage loop when the NCLK signal is high. Data is latched into the Master when the NCLK signal is low.

In flip-flop mode 404, the latch-enable signal LE is in a low state. At the falling edge of the NCLK signal, the input data pulse IN changes state with a corresponding change in state of the output signal OUT. With the next falling edge of the NCLK signal, the input data signal IN changes state. The data signal level at the output OUT changes state accordingly.

According to a disclosed class of innovative embodiments, there is provided: An integrated D-type latch/D-type flip-flop circuit, comprising: an input terminal and an output terminal for the conduction of data signals; first and second storage circuits interposed between said terminals for the storage of said data signals, and each connected to receive a first and second set of complementary signals at respective control terminals thereof; wherein each set of said complementary signals are derived independently of one another; a first inverter circuit interposed between said input terminal and said first storage circuit, and connected to receive said first set of complementary signals at respective control terminals thereof; a second inverter circuit interposed between said first storage circuit and said second storage circuit, and connected to receive said first and second set of complementary signals at respective control terminals thereof; and first and second control circuits; wherein said first control circuit is operatively connected between said input terminal and said first storage circuit, and in parallel with said first inverter circuit; wherein said second control circuit is operatively connected between said input terminal and said second storage circuit, and said input terminal and said output terminal; wherein propagation time delay of said data signal to said first storage circuit most nearly approximates said propagation delay from said input terminal to said second storage circuit; whereby said second set of complementary signals are independent of the state of said first set of complementary signals.

According to another disclosed class of innovative embodiments, there is provided: A integrated bus-interface circuit, comprising: a D-type latch/D-type flip-flop circuit, comprising: an input terminal and an output terminal for the conduction of data signals; first and second storage circuits interposed between said terminals for the storage of said data signals, and each connected to receive a first and second set of complementary signals at respective control terminals thereof; wherein each set of said complementary signals are derived independently of one another; a first inverter circuit interposed between said input terminal and said first storage circuit, and connected to receive said first set of complementary signals at respective control terminals thereof; a second inverter circuit interposed between said first storage circuit and said second storage circuit, and connected to receive said first and second set of complementary signals at respective control terminals thereof; and first and second control circuits; wherein said first control circuit is operatively connected between said input terminal and said first storage circuit, and in parallel with said first inverter circuit; wherein said second control circuit is operatively connected between said input terminal and said second storage circuit, and said input terminal and said output terminal; wherein propagation time delay of said data signal to said first storage circuit most nearly approximates said propagation delay from said input terminal to said second storage circuit; whereby said second set of complementary signals are independent of the state of said first set of complementary signals.

According to another disclosed class of innovative embodiments, there is provided: An integrated D-type latch/ D-type flip-flop circuit, having an input terminal and an output terminal, comprising: first and second storage circuits interposed between said terminals for the storage of data signals, and each connected to receive a first and second set of complementary signals at respective control terminals thereof; first and second latching circuits connected to latch said data signals into said storage circuits, and each of said latching circuits being connected to receive said first and second sets of complementary signals at respective control terminals thereof; wherein said first latching circuit is interposed between said input terminal and said first storage circuit; wherein said second latching circuit is interposed between said first and second storage circuits; wherein said data being latched into said storage circuits is in a dependent timing relationship with said sets of complementary signals and a third signal; a data control circuit operatively connected between said input and output terminals for the control of data signals to said second storage circuit; wherein said data control circuit is connected to receive said first set of complementary signals; and a timing circuit for the generation of said second set of complementary signals; wherein said second set of complementary signals is derived from the logical combination of at least one signal of said set of first complementary signals, and said third signal; wherein if said one of said set of first complementary signals is delayed longer than the propagation time delay of said data signal to said first storage circuit, said data is stored into said first and second storage circuits independent of said third signal.

According to another disclosed class of innovative embodiments, there is provided: An integrated bus-interface circuit, comprising: a D-type latch/D-type flip-flop circuit, having an input terminal and an output terminal, comprising: first and second storage circuits interposed between said terminals for the storage of data signals, and each connected to receive a first and second set of complementary signals at respective control terminals thereof; first and second latching circuits connected to latch said data signals into said storage circuits, and each of said latching circuits being connected to receive said first and second sets of complementary signals at respective control terminals thereof; wherein said first latching circuit is interposed between said input terminal and said first storage circuit; wherein said second latching circuit is interposed between said first and second storage circuits; wherein said data being latched into said storage circuits is in a dependent timing relationship with said sets of complementary signals and a third signal; a data control circuit operatively connected between said input and output terminals for the control of data signals to said second storage circuit; wherein said data control circuit is connected to receive said first set of complementary signals; and a timing circuit for the generation of said second set of complementary signals; wherein said second set of complementary signals is derived from the logical combination of at least one signal of said set of first complementary signals, and said third signal; wherein if said one of said set of first complementary signals is delayed longer than the propagation time delay of said data signal to said first storage circuit, said data is stored into said first and second storage circuits independent of said third signal.

According to another disclosed class of innovative embodiments, there is provided: A method for clocking an integrated D-type latch/D-type flip-flop circuit, comprising the steps of conducting a data signal from an input terminal to an output terminal; switching said input signal between opposing states in dependence on first and second complementary signals; wherein a first switching circuit is interposed between said input terminal and first storage circuit; wherein a second switching circuit is interposed between said first and second storage circuits; controlling said input data signal through first and second control circuits; wherein said first control circuit is operatively connected between said input terminal and said first storage circuit; wherein said second control circuit is operatively connected between said input terminal and said second storage circuit; wherein propagation time delay of said data signal to said first storage circuit most nearly approximates said propagation delay time from said input terminal to said second storage circuit; latching said data signal into said first and second storage circuits in dependence on said first and second complementary signals; and outputting said data signal from either of said first and second storage circuits in dependence on said first and second complementary signals.

According to another disclosed class of innovative embodiments, there is provided: A method for clocking a data signal in an integrated D-type latch/D-type flip-flop circuit, comprising the steps of: conducting a data signal from an input terminal to an output terminal; latching said input data signal into first and second storage circuits in dependence on first and second complementary signals, said storage circuits interposed between said terminals; wherein a first latching circuit is operatively connected between said input terminal and said first storage circuit; wherein a second latching circuit is operatively connected between said first and second storage circuits; controlling said input data signal with a control circuit; wherein said control circuit is operatively connected between said input terminal and said second storage circuit; and generating said second set of complementary signals from a logical combination of at least one of said first set of complementary signals and a third signal; wherein if said one of said set of first complementary signals is delayed longer than the propagation time delay of said data signal to said first storage circuit, said data is stored into said first and second storage circuits independent of said third signal.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other circuit elements can be added to, or substituted into, the specific circuit topologies shown.

For another example, within the constraints well-known to those of ordinary skill, power MOS transistors can be replaced by IGBT and/or MCT devices, with appropriate allowance for reduced turn-off times. In some applications power bipolar devices can also be used.

For another example, within the constraints well-known to those of ordinary skill, nonlinear devices can be added in series with (or used to replace) resistors, to increase the impedance of load devices.

For another example, within the constraints well-known to those of ordinary skill, a variety of well-known current mirror configurations can be substituted for those shown.

For another example, within the constraints well-known to those of ordinary skill, a variety of well-known amplifier configurations can be substituted for those shown.

What is claimed is:

1. An integrated D-type latch/D-type flip-flop circuit, comprising:
    an input terminal and an output terminal for the conduction of data signals;
    first and second storage circuits interposed between said input and output terminals for the storage of said data signals, and each connected to receive a first and second set of complementary signals at respective control terminals thereof; wherein each set of said complementary signals are derived independently of one another;
    a first inverter circuit interposed between said input terminal and said first storage circuit, and connected to receive said first set of complementary signals at respective control terminals thereof;
    a second inverter circuit interposed between said first storage circuit and said second storage circuit, and connected to receive said first and second set of complementary signals at respective control terminals thereof; and
    first and second control circuits; wherein said first control circuit is operatively connected between said input terminal and said first storage circuit, and in parallel with said first inverter circuit; wherein said second control circuit is operatively connected between said input terminal and said second storage circuit, and said input terminal and said output terminal; wherein the propagation time delay of a data signal from said input terminal to said first storage circuit via the first control circuit most nearly approximates the propagation time delay of a data signal from said input terminal to said second storage circuit via the second control circuit;
    whereby said second set of complementary signals are independent of the state of said first set of complementary signals.

2. The integrated circuit of claim 1, wherein said first set of complementary signals are clocking signals.

3. The integrated circuit of claim 1, wherein said second set of complementary signals are latch-enable signals.

4. The integrated circuit of claim 1, wherein said first and second control circuits comprise complementary MOS devices.

5. An integrated bus-interface circuit, comprising:
    a D-type latch/D-type flip-flop circuit, comprising:
        an input terminal and an output terminal for the conduction of data signals;
        first and second storage circuits interposed between said input and output terminals for the storage of said data signals, and each connected to receive a first and second set of complementary signals at respective control terminals thereof; wherein each set of said complementary signals are derived independently of one another;
        a first inverter circuit interposed between said input terminal and said first storage circuit, and connected to receive said first set of complementary signals at respective control terminals thereof;
        a second inverter circuit interposed between said first storage circuit and said second storage circuit, and connected to receive said first and second set of complementary signals at respective control terminals thereof; and
        first and second control circuits; wherein said first control circuit is operatively connected between said input terminal and said first storage circuit, and in parallel with said first inverter circuit; wherein said second control circuit is operatively connected between said input terminal and said second storage circuit, and said input terminal and said output terminal; wherein the propagation time delay of a data signal from said input terminal to said first storage circuit via the first control circuit most nearly approximates the propagation time delay of a data signal from said input terminal to said second storage circuit via the second control circuit;
        whereby said second set of complementary signals are independent of the state of said first set of complementary signals.

6. The integrated circuit of claim 5, wherein said first set of complementary signals are clocking signals.

7. The integrated circuit of claim 5, wherein said second set of complementary signals are latch-enable signals.

8. The integrated circuit of claim 5, wherein said first and second control circuits comprise complementary MOS devices.

9. An integrated D-type latch/D-type flip-flop circuit, having an input terminal and an output terminal, comprising:
   first and second storage circuits interposed between said input and output terminals for the storage of data signals, and each connected to receive a first and second set of complementary signals at respective control terminals thereof;
   first and second circuits connected to provide said data signals into said storage circuits, and each of said circuits being connected to receive said first and second sets of complementary signals at respective control terminals thereof; wherein said first circuit is interposed between said input terminal and said first storage circuit; wherein said second circuit is interposed between said first and second storage circuits; wherein said data signals being provided into said storage circuits are in a dependent timing relationship with said sets of complementary signals and a third signal;
   a data control circuit operatively connected between said input and output terminals for the control of said data signals to said second storage circuit; wherein said data control circuit is connected to receive said first set of complementary signals; and
   a timing circuit for generating of said second set of complementary signals; wherein said second set of complementary signals is derived from the logical combination of at least one signal of said set of first complementary signals, and said third signal; wherein when said one of said set of first complementary signals has longer delay than the propagation time delay of a data signal from said input terminal to said first storage circuit, said data signal is stored into said first and second storage circuits independent of said third signal.

10. The integrated circuit of claim 9, wherein said first set of complementary signals are clocking signals.

11. The integrated circuit of claim 9, wherein said second set of complementary signals are latch-enable signals.

12. The integrated circuit of claim 9, wherein said data control circuit comprises complementary MOS devices.

13. An integrated bus-interface circuit, comprising:
   a D-type latch/D-type flip-flop circuit, having an input terminal and an output terminal, comprising:
      first and second storage circuits interposed between said input and output terminals for the storage of data signals, and each connected to receive a first and second set of complementary signals at respective control terminals thereof;
      first and second circuits connected to provide said data signals into said storage circuits, and each of said circuits being connected to receive said first and second sets of complementary signals at respective control terminals thereof; wherein said first circuit is interposed between said input terminal and said first storage circuit; wherein said second circuit is interposed between said first and second storage circuits; wherein said data signals being provide into said storage circuits are in a dependent timing relationship with said sets of complementary signals and a third signal;
      a data control circuit operatively connected between said input and output terminals for the control of said data signals to said second storage circuit; wherein said data control circuit is connected to receive said first set of complementary signals; and
      a timing circuit for generating of said second set of complementary signals; wherein said second set of complementary signals is derived from the logical combination of at least one signal of said set of first complementary signals, and said third signal; wherein when said one of said set of first complementary signals has longer delay than the propagaton time delay of a data signal from said input terminal to said first storage circuit, said data signal is stored into said first and second storage circuits independent of said third signal.

14. The integrated circuit of claim 13, wherein said first set of complementary signals are clocking signals.

15. The integrated circuit of claim 13, wherein said second set of complementary signals are latch-enable signals.

16. The integrated circuit of claim 13, wherein said data control circuit comprises complementary MOS devices.

17. A method for clocking an integrated D-type latch/D-type flip-flop circuit, comprising the steps of:
   (a.) conducting a data signal from an input terminal to an output terminal;
   (b.) switching said data signal using a first switching circuit and a second switching circuit, between opposing states in dependence on first and second sets of complementary signals; wherein said first switching circuit is interposed between said input terminal and a first storage circuit; wherein said second switching circuit is interposed between said first storage circuit and a second storage circuit;
   (c.) controlling said data signal through first and second control circuits; wherein said first control circuit is operatively connected between said input terminal and said first storage circuit; wherein said second control circuit is operatively connected between said input terminal and said second storage circuit, and said input terminal and said output terminal; wherein the propagation time delay of said data signal from said input terminal to said first storage circuit via said first control circuit most nearly approximates said propagation delay time of said data signal from said input terminal to said second storage circuit via said second control circuit;
   (d.) latching said data signal into said first and second storage circuits in dependence on said first and second sets of complementary signals; and
   (e.) outputting said data signal from either of said first and second storage circuits in dependence on said first and second sets of complementary signals.

18. The method of claim 17, wherein said first set of complementary signals are clocking signals.

19. The method of claim 17, wherein said second set of complementary signals are latch-enable signals.

20. The method of claim 17, wherein said first and second control circuits comprise complementary MOS devices.

21. A method for clocking a data signal in an integrated D-type latch/D-type flip-flop circuit, comprising the steps of:
   (a.) conducting a data signal from an input terminal to an output terminal;
   (b.) providing said data signal into first and second storage circuits using first and second circuits in dependence on first and sets of complementary signals, said storage circuits interposed between said input and output terminals; wherein said first latching circuit is operatively connected between said input terminal and said first storage circuit; wherein said second circuit is operatively connected between said first and second storage circuits;

(c.) controlling said data signal with a control circuit; wherein said control circuit is operatively connected between said input terminal and said second storage circuit; and (d.) generating said second set of complementary signals from a logical combination of at least one of said first set of complementary signals and a third signal; wherein when said one of said set of first complementary signals has longer delay than the propagation time delay of said data signal from said input terminal to said first storage circuit, said data signal is stored into said first and second storage circuits independent of said third signal.

22. The method of claim 21, wherein said first set of complementary signals are clocking signals.

23. The method of claim 21, wherein said second set of complementary signals are latch-enable signals.

24. The method of claim 21, wherein said first and second control circuits comprise complementary MOS devices.

* * * * *